(12) United States Patent
Pitel

(10) Patent No.: US 6,969,471 B2
(45) Date of Patent: Nov. 29, 2005

(54) PROCESS FOR MANUFACTURING PRINTED CIRCUIT BOARDS WITH PROTECTED SPACES BETWEEN TRACKS

(75) Inventor: Jose Antonio Cubero Pitel, Tarragon Valls (ES)

(73) Assignee: Lear Corporation, Southfield, MI (US)

( * ) Notice: Subject to any disclaimer, the term of this patent is extended or adjusted under 35 U.S.C. 154(b) by 182 days.

(21) Appl. No.: 10/707,640

(22) Filed: Dec. 29, 2003

(65) Prior Publication Data

US 2005/0145595 A1 Jul. 7, 2005

(51) Int. Cl.⁷ .............................................. C25F 3/00
(52) U.S. Cl. ........................... 216/17; 216/20; 216/55; 216/62
(58) Field of Search ............................. 216/17, 20, 55, 216/62

(56) References Cited

U.S. PATENT DOCUMENTS

| | | | |
|---|---|---|---|
| 5,716,663 A * | 2/1998 | Capote et al. ................ 156/27 |
| 6,163,957 A * | 12/2000 | Jiang et al. .................... 29/852 |
| 6,272,745 B1 * | 8/2001 | Kersten et al. ............... 29/852 |
| 6,370,768 B1 * | 4/2002 | Itabashi ........................ 29/852 |
| 2002/0032961 A1 * | 3/2002 | Matsuda ...................... 29/847 |
| 2003/0077060 A1 * | 4/2003 | Chen et al. ................. 385/129 |

* cited by examiner

*Primary Examiner*—Nadine G. Norton
*Assistant Examiner*—Binh X. Tran
(74) *Attorney, Agent, or Firm*—Bruce E Harang

(57) ABSTRACT

It comprises the steps of: a) arranging a dielectric substrate (1) with at least one conducting plate (2) joined by an adhesive (8) to at least one of its sides; b) removing areas of said plate (2) by selective chemical milling to provide conducting tracks (5) joined to the substrate (1) and separated by spaces between tracks (6); c) applying and hardening by radiation an electroinsulating filler material (7) to fill said spaces between tracks (6), covering the tracks (5); d) applying an abrasion treatment to obtain flush upper surfaces (3) of the filler material (7) and of the tracks; and e) cooling, after step c) and during step d), the printed circuit board to reduce the temperature of the filler material (7) to under its glass transition temperature.

17 Claims, 2 Drawing Sheets

PROCESS FOR MANUFACTURING PRINTED CIRCUIT BOARDS WITH PROTECTED SPACES BETWEEN TRACKS

BACKGROUND OF INVENTION

1. Field of the Art

The present invention refers to a process for manufacturing printed circuit boards with spaces existing between the conducting tracks protected by a resinous, cured insulating filler material, the upper surfaces of the tracks and of the filler material being flush.

2. Background of the Invention

In printed circuit boards intended for power circuits, the conducting tracks, which are typically of copper, have a considerably large thickness so as to allow high current intensities (in the order of several amperes) circulating through them, without becoming heated beyond a predetermined threshold. Furthermore, sufficiently large separation spaces between the tracks are necessary for preventing the occurrence of electric arcs. The tracks are conventionally obtained by chemical milling of a copper plate adhered to a dielectric substrate, and in said process, the material of the tracks is exposed on the upper part and on the side edges of the tracks, and, as a result, have the risk of undergoing corrosion. Usually, a layer of solder resistant mask is subsequently applied to the outer surface of the tracks (to facilitate later installation of components by flow soldering), which layer also acts as protection against corrosion. However in some applications, such as printed circuit boards installed in motorized vehicles, for example, there are adverse environmental conditions such as humidity, saline atmosphere and vibrations or mechanical loads, among others, greatly increasing the risk of corrosion in the exposed material of the side edges of the tracks.

The applicant has developed interconnection boxes for automotive power applications in which printed circuits having a thickness exceeding 200 microns, and typically in the order of 400 microns, are used. Thus, Spanish patents ES-A 2 021 545, ES-A-2 124 177, ES-A-2 071 540 and ES-A-2 140 310 can be mentioned.

The published international patent application WO 97/16056 sets forth a resin filler for a multilayer printed circuit board in which said resin filler is arranged in the recesses existing on the surface of the printed circuit board, or in the through holes provided for therein. As a background, this patent mentions a method disclosed in Japanese patent JP-A-63-137499, published in 1986, consisting of using as a filler material, an epoxy resin paste with a viscosity adjusted to a suitable value for application thereof by prior dilution with a solvent.

A printed circuit board applicable to power circuits is known by Spanish Utility Model ES-A-103341, comprising a dielectric laminar substrate, conducting tracks, having a thickness in the order of 400 $\mu$m, applied to said substrate, and separation spaces between said tracks, where the edges of the tracks are coated with a dielectric ink protecting them from corrosive effects in moist and/or saline environments, and increasing the dielectric coefficient between adjacent tracks. This dielectric ink also acts as a solder resistant mask to facilitate installation of components by flow soldering. The dielectric ink can be applied by spraying, by curtaining, by platen roller or by silk-screening methods, and, in reference to the drawings attached thereto, it can be seen how the dielectric ink completely fills the spaces between tracks and also covers the tracks. Although it is not indicated in this Utility Model, FIG. 2 of the drawings shows that a completely flat outer surface of the circuit is not obtained, but rather there are recesses in correspondence with the areas filled with dielectric ink.

Spanish Utility Model application ES-A 1051902, with priority of German patent application DE-10121673.4, discloses a printed circuit board made up of a dielectric laminar substrate, conducting tracks applied to said substrate and separation spaces between said tracks. The thickness of the tracks is noticeably greater than 100 $\mu$m, and said spaces between tracks are filled with a dielectric material hardened by heat or ultraviolet radiation, having the greatest possible adhesion to the tracks, to the substrate and to a solder resistant mask applied to the printed circuit board, such that this printed board has an essentially flat upper surface, without breaks or recesses.

This last document does not provide information concerning the particularities of the process for applying the filler material, and an experiment with any of the known application techniques verifies that a filler material deposit is formed on top of the tracks in addition to between the tracks. Accordingly, to obtain said essentially flat upper surface, without breaks or recesses, including flush upper surfaces of the tracks and of the filler material, it is necessary to carry out an operation to remove the filler material from the top part of the tracks. One such operation can be carried out, for example, by abrasion by means of grinding wheels, platen rollers or abrasive brushes following a step for curing or hardening the filler material by heat or ultraviolet radiation.

However, this abrasion operation affecting the outer face or view of the conducting tracts causes a temperature increase of the tracks and of the filler material, which is already relatively high as a result of said curing step, after the conclusion thereof, being able to easily exceed the glass transition temperature of the filler material. When this occurs, the filler material is degraded, its internal structure changes, and it loses some of its essential features, such as, for example, resilience and adhesive power, becoming brittle and tending to become detached from the tracks and from the substrate. On the other hand, it is advisable for the filler material to have a low glass transition temperature since the lower the temperature is, the more resilient and adherent the filler material is. This means that the temperature threshold which it should not exceed is relatively low, which contradicts the necessity to carry out an abrasion operation and the temperature increase this implies.

Said mechanical polishing process will also cause thermal fatigue of the Cu of the conducting tracks, partly weakening their adherence to the substrate.

It must also be taken into account that said temperature increase together with the increase that will occur during the later soldering of components to the tracks, and generally due to any exposure of the printed circuit to a heat source, will cause a different expansion in the filler material and in the conducting material of the tracks because of their different thermal expansion coefficients, which will cause pressures on the side edges of the tracks, which will be translated into a shear stress which will affect the layer of adhesive material normally joining the tracks to the substrate. Such stress can lead to a detachment of the tracks from the substrate during the abrasion step or at a later time.

The object of the present invention is to provide a process for manufacturing printed circuit boards with spaces between tracks protected by means of a filler material which prevents the drawbacks described above caused by excessive heating in an abrasion step, and providing good insulation resistance and dielectric strength features.

Another object of the invention is that of being able to integrate on the circuit produced, in which there is no unevenness between tracks and substrate, electronic components by means of the Surface Mount Technology (SMT), and as a result, providing a circuit in which power and electronics are combined.

Another object of the invention is that of making it possible to obtain printed circuits with a conducting track thickness exceeding 200 microns, and with a spacing between said tracks of less than the conventional spacing (as it is filled with a dielectric substance), and generally with a minimum spacing of less than 0.9 mm, which provides the possibility of mounting a greater diversity of electronic components, and among them, fine pitch type electronic components.

BRIEF EXPLANATION OF THE INVENTION

The aforementioned and other objects are achieved, according to the present invention, by providing a process for manufacturing printed circuit boards with protected spaces between tracks, of the type comprising, as conventionally, the steps of: a) arranging an initial board made up of a substrate in the form of a two-sided board of a dielectric material, and at least one plate of a conducting material, joined by means of a layer of adhesive to at least one of said sides of the substrate; b) removing, by means of a selective chemical milling process with photoresist, areas of said plate to provide tracks of said conducting material joined to said substrate and separated by spaces between tracks; c) applying on said substrate and tracks a resinous electroinsulating filler material to fill said spaces between tracks, covering the tracks, and hardening said filler material by heat or ultraviolet radiation; and d) applying an abrasion treatment of the filler material and upper part of the tracks to obtain flush upper surfaces of the filler material and of the tracks, the process being characterized in that it comprises the additional step of: e) after step c) and during step d), subjecting the printed circuit board to cooling to carry out a temperature reduction in the filler material to below its glass transition temperature, and maintaining this temperature, preferably, at all times.

The process of the invention has a special application in printed circuit boards intended for power circuits, especially in the automotive sector, in which the tracks are made of copper and have a thickness of 210 $\mu$m to 400 $\mu$m to withstand high intensities without becoming excessively overheated during use, whereas said layer of adhesive joining them to the substrate has a peel strength of at least 6 N/mm, and preferably of 8 N/mm or more, which ensures stability of the coupling. The filler material arranged in the areas between tracks is a bi-component or single-component resin, which can be hardened by ultraviolet radiation, and with a glass transition temperature $T_g$ (obtained by means of thermomechanical analysis) comprised between 40° C. and 130° C., although as indicated above, a low glass transition temperature of around approximately 40° C. is preferable. Since in the filler material hardening step c) the temperature of the board can reach up to approximately 80° C., said temperature reduction in the filler material is carried out in order to take the filler material from approximately 80° C. at the conclusion of step c) to approximately 30° C. at the beginning of the abrasion step d), for a glass transition temperature of the filler material of approximately 40° C.

To cause said cooling, different methodologies could be used, such as cool air circulation through the operative area.

The filler material application step c) is preferably carried out following step b) without polishing irregularities on the ridges, cants or edges created on the tracks by chemical milling, as normally occurs in the processes in the state of the art, since such irregularities cooperate in a good adhesion of the filler material to the tracks. The flush upper surfaces of the tracks and the filler material obtained by means of the process of the invention largely facilitate an additional, conventional step f) for applying, by means of a selective printing process, a solder resistant mask on selected areas of said flush upper surfaces, and hardening it by heat or ultraviolet radiation. The thickness of said solder resistant mask is preferable from 21 $\mu$m to 30 $\mu$m.

Also due to chemical milling, the side edges or flanks of the tracks are not perpendicular to the substrate, therefore the width of the spaces between tracks varies with the distance to the substrate. In the boards obtained by the process of the invention, the average width of said spaces between tracks ranges from 0.3 mm to 0.5 mm for a track thickness of 210 $\mu$m to 0.5 $\mu$m to 1.0 mm for a track thickness of 400 $\mu$m, although for 400 $\mu$m-thick tracks, an average width of the spaces between tracks of 0.8 mm to 1.0 mm is preferred. This makes it possible to mount components with a pitch (spacing between connection elements) of less than 0.9 mm.

The filler material can be an acrylic resin or an epoxy resin with a density of approximately 1.35 g/cm$^3$ and a viscosity, at the time of its application, ranging from 14500 mPas to 20000 mPas for a track thickness of 400 $\mu$m, from 26000 mPas to 30000 mPas for a track thickness of 210 $\mu$m.

BRIEF DESCRIPTION OF DRAWINGS

The aforementioned and other features and advantages will be better understood from the following detailed description of an embodiment of the process according to the present invention, with reference to the attached drawings, in which.

DETAILED DESCRIPTION

Figure 1:
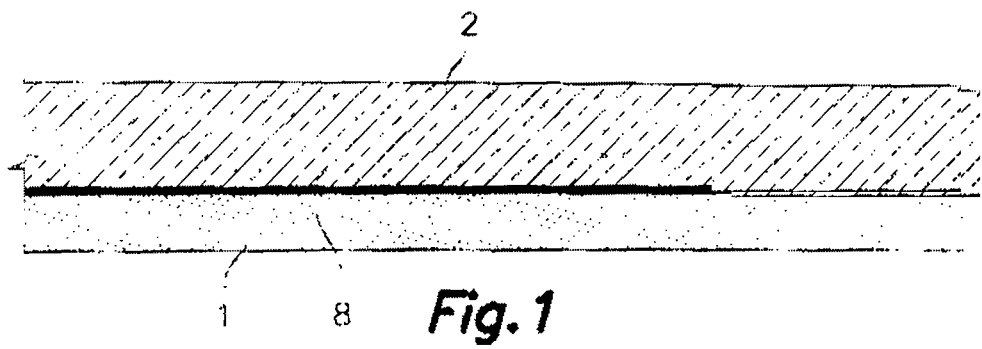
FIG. 1 shows an enlarged schematic cross-sectional view of an initial one-sided board from which a first embodiment of the process of the present invention is carried out.
Figure 6:
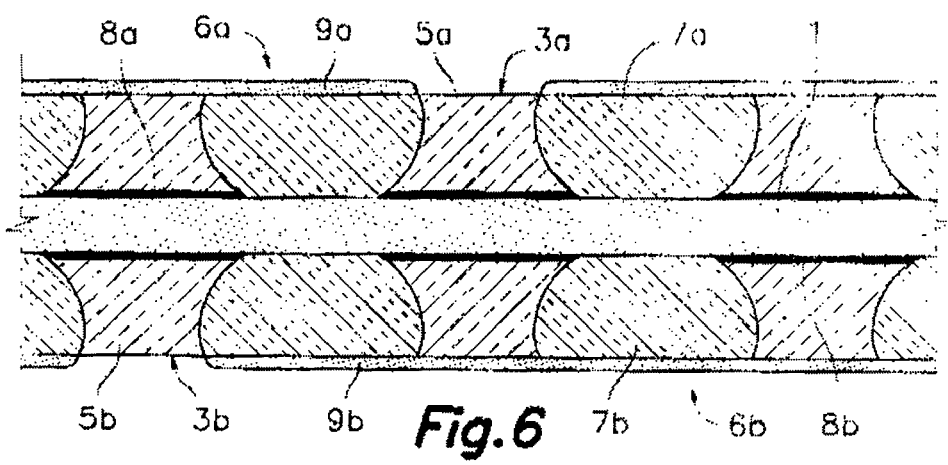
FIG. 6 shows an enlarged schematic cross-sectional view of a two-sided printed circuit board with the protected spaces between tracks obtained by means of a second embodiment example of the present invention.

Firstly in reference to FIG. 1, said figure shows an initial board used as a starting material for carrying out a one-sided printed circuit board with protected spaces between tracks by means of a first embodiment example of the process according to the present invention. The initial board shown in FIG. 1 is a conventional-type, one-sided board, and is made up of a substrate 1 in the form of a laminar board of a dielectric material with two main sides, and a plate 2 of a conducting material joined by means of a layer of adhesive 8 to one of said sides of the substrate 1. A second embodiment example of the process of the present invention, briefly described below in relation to FIG. 6, is likewise useful for manufacturing two-sided printed circuit boards with protected spaces between tracks. In this second embodiment, an initial, also conventional, two-sided board (not shown) is used, made up of a substrate similar to the one described above but with two conducting plates, each one adhered to a respective side of the two main sides of the substrate. In both cases, the substrate can be any of the dielectric materials commonly used for that purpose in the sector, such as those called FR2, FR3, FR4, CEM1, CEM2 or CEM3, and said conducting plate(s) 2 is/are preferably of copper, and has/have a suitable thickness for providing tracks with a thickness of 210 $\mu$m to 400 $\mu$m, suitable for power circuits. Said layer of adhesive 8 has a peel strength of at least 6 N/mm, and preferably of no less than 8 N/mm, for the purpose of withstanding shear stresses produced by pressures on the side edges of the future tracks due to subsequent steps of the process of the invention described below.

Figure 2:
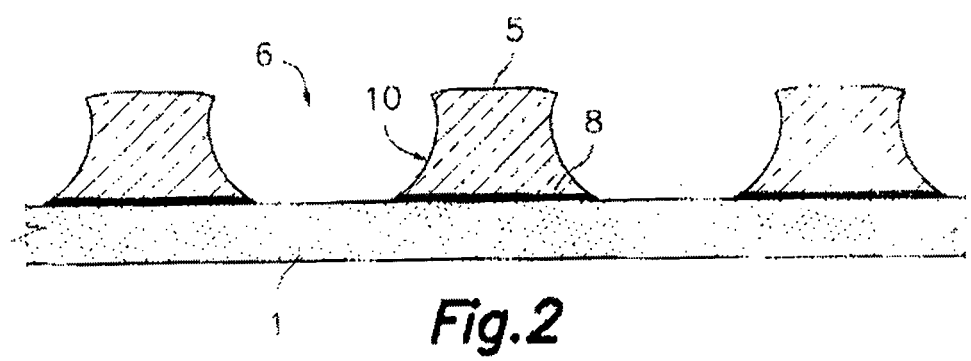
FIG. 2 shows an enlarged schematic cross-sectional view of the board of FIG. 1, from which the conducting tracks have been obtained.

Moving on to FIG. 2, said figure shows the result of a conventional step consisting in removing areas of said plate 2 by means of a selective chemical milling process, to provide tracks 5 of said conducting material joined to said substrate 1 by means of said layer of adhesive 8, and separated by spaces between tracks 6. Said chemical milling process is well known in the state of the art, therefore it has not been shown, and implies, according to one possible embodiment, brushing the surface of the copper plate, applying thereon a layer of photosensitive resist resin, selectively exposing areas of the layer of resin to a light source by means of a cliché with the configuration of the tracks 5, revealing the layer of photo-sensitive resin to remove therefrom several areas corresponding to said spaces between tracks 6 and subjecting the initial board thus prepared to a chemical bath to corrode and remove those areas of the copper plate 2 not protected by the photosensitive resist resin. With this, a printed circuit board like the one schematically shown in FIG. 2 is obtained, which, after a washing, is preferably subjected to an electrical check in order to dispose of those boards which may be defective.

It is important to point out that the previous chemical milling process does not provided flat edges, flanks or side edges 10 of the tracks 5, perpendicular to the substrate 1, as they are often schematically shown, but rather said flanks 10 have a rough surface and, when seen in a cross-sectional view as in FIG. 2, have a concave curved profile with the widest part of the tracks 5 located next to the substrate 1, and the narrowest part near its upper outer surface. In consistence with this, the spaces between tracks 6 are limited in a lateral manner by convex curved profile surfaces, and their narrowest part is next to the substrate 1, and their widest part is close to their outer part.

The average minimum width of said spaces between tracks 6 preferably ranges from 0.3 mm to 0.5 mm for a track thickness of 210 $\mu$m, up to 0.5 mm to 1.0 mm for a track thickness of 400 $\mu$m. For a track 5 thickness of 400 $\mu$m, it is more preferable for the average width of said spaces between tracks 6 to range from 0.8 mm to 1.0 mm.

Figure 3:
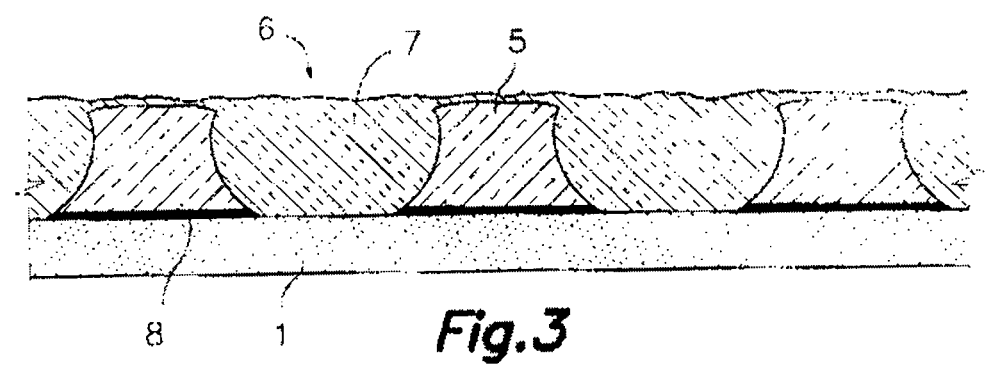
FIG. 3 shows an enlarged schematic cross-sectional view showing the spaces between the tracks of the board of FIG. 2 filled with a filler material.

Then, as shown in FIG. 3, a resinous, insulating filler material 7 is applied on the printed circuit board made up of the substrate 1 and the tracks 5, in order to fill the spaces between tracks 6. The filler material is then cured or hardened by heat or ultraviolet radiation, depending on the composition thereof. By means of this operation, said filler material 7 remains, unavoidably, covering the tracks 5 in a more or less irregular manner. Advantageously, the step for applying the filler material 7 is carried out without polishing the side edges 10 created on the tracks 5 due to the chemical milling process used for their obtainment, since said rough surfaces and concave curved profiles of the tracks cooperate in providing greater adhesion of the filler material 7 to the tracks 5.

A filler material 7 suitable for being arranged in the spaces between tracks 6 is a bi-component or single-component resin, hardened by ultraviolet radiation, with a density of approximately 1.35 g/cm$^3$, and a glass transition temperature of 40° C. to 130° C. The lowest possible glass transition temperature is preferred, for example from 40° C. to 60° C., since this means grater resilience for the filler material 7. Optimal viscosity for the filler material 7 at the time of its application varies according to the thickness of the tracks 5, a lower viscosity being advisable the thicker the tracks are. Thus, for example, a suitable viscosity for a track thickness of 400 $\mu$m is from 14500 mPas to 20000 mPas, and for a track thickness of 210 $\mu$m, suitable viscosity is from 26000 mPas to 30000 mPas. The previous properties and features can be obtained from an acrylic resin or an epoxy resin.

The resin used is also characterized by a very low shrinkage during the curing process, which minimizes the volume loss causing an unwanted concave profile for the required flatness. Said resin must have good resistance to a soldering bath (thus facilitating the later process of mounting components by flow soldering).

The resin used must make it possible for the curing process to be short, for example in the order of 5 to 10 seconds with a power contribution of 3500 mJ/cm$^2$.

Figure 4:
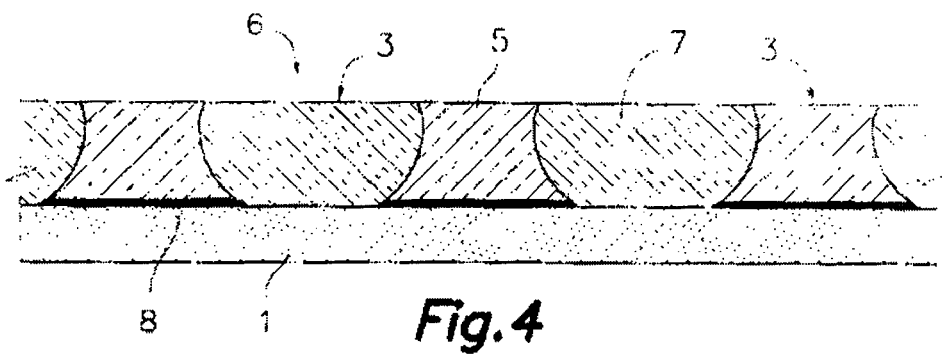
FIG. 4 shows an enlarged schematic cross-sectional view showing flush upper surfaces of the tracks and the filler material obtained by abrasion of the board of FIG. 3.

Now in reference to FIG. 4, said figure shows the result of a subsequent step consisting in applying an abrasion treatment to the filler material 7 and upper part of the tracks 5 in order to slightly lower them until obtaining flush upper surfaces 3 of the filler material 7 and of the tracks 5. This treatment can be easily applied by means of, for example, grinding wheels or abrasive platen rollers. However, the high-speed abrasion work carried out by abrasive tools on the filler resin material and on the copper of the tracks generates heat which increases the temperature of the filler material 7, which is already above room temperature since it is coming from the curing by radiation step. If the filler material 7 is heated above its glass transition temperature, it can lose its behavioral properties and features, especially its resilience.

To prevent this from occurring, after the curing or hardening step and during the abrasion step, the additional step of subjecting the printed circuit board to cooling is included in order to bring about a decrease of the temperature of the filler material 7 to below its glass transition temperature. The temperature of the filler material 7 at the conclusion of the curing step is approximately 80° C., and it is advisable to take it to a temperature below its glass transition temperature, i.e. to approximately 30° C. for a material with a glass transition temperature of approximately 40° C., prior to beginning the abrasion step, and maintaining it approximately at this level for the duration thereof. Accordingly, the required thermal difference is of approximately 50° C.

Figure 5:
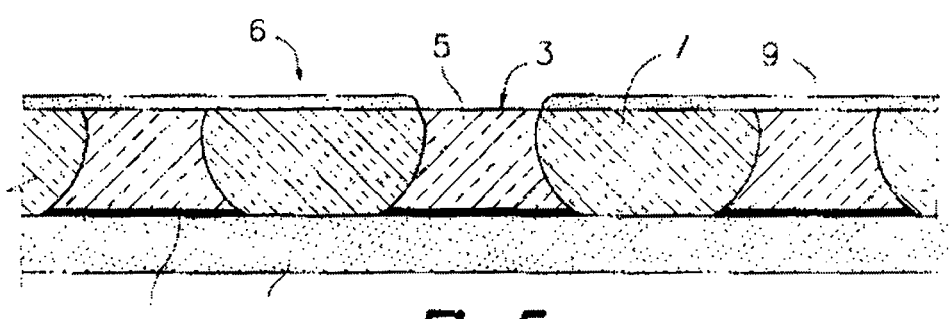
FIG. 5 shows an enlarged schematic cross-sectional view showing a layer of solder resistant mask applied on selected areas of the flush surfaces of the board of FIG. 4.

Finally in reference to FIG. 5, after the step for leveling by abrasion and for brushing the obtained flush surfaces 3, the process comprises the additional step of applying a solder resistant mask 9 on selected areas of said flush upper surfaces 3 of the tracks 5 and filler material 7. This is carried out by a conventional printing process (not shown) which includes selectively printing, for example by means of silk-screening, a 21 μm to 30 μm-thick layer of resin with good lead and/or tin solder resistance features and then hardening it by heat or ultraviolet radiation. Said solder resistant mask 9 forms a protective layer on the printed circuit board, leaving only small areas of the flush upper surfaces 3 corresponding to the copper tracks 5 exposed. The individual components of the printed circuit board will be soldered, for example by means of the conventional flow soldering process, in these small exposed areas.

Therefore, as shown in FIG. 5, once finished, the printed circuit board obtained by the first embodiment of the process of the present invention, comprises a dielectric substrate 1, on one side of which conducting tracks 5 are fixed by means of a layer of adhesive 8, a filler material 7 arranged in the spaces between tracks 6 and a solder resistant mask 9 on flush upper surfaces 3 of the tracks 5 and of the filler material 7, in which only several small areas of the copper of the flush upper surface 3 of the tracks 5 are exposed, which areas will later be coated with the material for soldering the components, thereby leaving no copper surface of the tracks unprotected. Furthermore, for better protection during a possible storage period prior to soldering the components, the printed circuit board receives a layer of organic material coating.

FIG. 6 shows a two-sided printed circuit board with protected spaces between tracks 6a, 6b, obtained by means of a second embodiment of the present invention, which comprises the same steps as the first embodiment, but with the following variations. The initial board, as indicated above, comprises a dielectric laminar substrate 1 with two main sides on which two plates of a conducting material are joined by means of respective layers of adhesive 8a, 8b. Tracks 5a, 5b and spaces between tracks 6a, 6b are obtained on both sides of the substrate 1 by means of an analogue chemical milling process. Then, the first steps for applying the filler material 7a, the curing, cooling and leveling by abrasion are carried out for obtaining the flush surfaces 3a on one side of the printed circuit board, it is flipped over and then the same steps for applying the filler material 7b, curing, cooling and leveling by abrasion are carried out for obtaining the flush surfaces 3b on the other, opposite side of the printed circuit board. Then, after the flush surface 3a, 3b brushing operation, the solder resistant mask 9a is applied and cured on one side of the printed circuit board, it is flipped over, and the solder resistant mask 9b is applied and cured on the other side of the printed circuit board.

A person skilled in the art will be able to introduce variations and modifications without exceeding the scope of the present invention as it is defined in the attached claims.

What is claimed is:

1. A process for manufacturing printed circuit boards with protected spaces between tracks, of the type comprising the steps of:
    a) arranging an initial board made up of a substrate (1) in the form of a two-sided board of a dielectric material, and at least one plate (2) of a conducting material, joined by means of a layer of adhesive (8) to at least one of said sides of the substrate (1);
    b) removing, by means of a selective chemical milling process with photoresist, areas of said plate (2) to provide tracks (5) of said conducting material joined to said substrate (1) and separated by spaces between tracks (6);
    c) applying on said substrate (1) and tracks (5) a resinous electroinsulating filler material (7) to fill said spaces between tracks (6), covering the tracks (5), and hardening said filler material (7) by heat or ultraviolet radiation; and
    d) applying an abrasion treatment on the filler material (7) and upper part of the tracks (5) to obtain flush upper surfaces (3) of the filler material (7) and tracks (5), characterized in that it comprises the additional step of:
    e) after step c) and during step d), subjecting the printed circuit board to cooling to carry out a reduction of temperature in the filler material (7) to below its glass transition temperature.

2. A process according to claim 1, characterized in that said tracks (5) are made of copper and have a thickness of 210 μm to 400 μm.

3. A process according to claim 2, characterized in that said reduction of temperature in the filler material (7) goes from approximately 80° C. at the conclusion of step c) to approximately 30° C. at the beginning of step d), for a glass transition temperature of the filler material (7) of approximately 40° C.

4. A process according to claim 2, characterized in that the step c) for applying the filler material (7) is carried out after step b) without polishing the edges (10) created on the tracks (5) by means of chemical milling.

5. A process according to claim 2, characterized in that the initial board is made up of a substrate (1) in the form of a two-sided board of a dielectric material, and two plates of a conducting material joined by means of two layers of adhesive (8a, 8b), one to each one of said sides of the substrate (1), carrying out step b) for chemical milling on both plates of conducting material to provide tracks (5a, 5b) separated by spaces between tracks (6a, 6b) on both sides of the substrate (1), and carrying out the subsequent steps c), d) and e) for application of the filler material (7a, 7b) and abrasion to obtain flush upper surfaces (3a, 3b), with the corresponding cooling, first on one side of the printed circuit board and then on the other side.

6. A process according to claim 2, characterized in that after step d), it comprises the additional step f) for applying a solder resistant mask (9) on selected areas of said flush upper surfaces (3) of the tracks (5) and filler material (7) by a selective printing process, and hardening it by heat or ultraviolet radiation.

7. A process according to claim 6, characterized in that the width of said solder resistant mask (9) is from 21 μm to 30 μm.

8. A process according to claim 2, characterized in that said layer of adhesive (8) has a peel strength of at least 6 N/mm.

9. A process according to claim 8, characterized in that said layer of adhesive (8) has a peel strength of at least 8 N/mm.

10. A process according to claim 2, characterized in that the average width of said spaces between tracks (6) ranges from 0.3 mm to 0.5 mm for a track (5) thickness of 210 μm, to a width from 0.5 mm to 1.0 mm for a track (5) thickness of 400 μm.

11. A process according to claim 10, characterized in that the average width of said spaces between tracks (6) ranges from 0.8 mm to 1.0 mm for a track (5) thickness of 400 μm.

12. A process according to claim 2, characterized in that the filler material (7) arranged in the spaces between tracks (6) is a bi-component or single-component resin, hardened by ultraviolet radiation, with a glass transition temperature comprised between 40° C. to 130° C.

13. A process according to claim 12, characterized in that the filler material (7) has a density of approximately 1.35 g/cm$^3$.

14. A process according to claim 12, characterized in that the filler material (7) is an acrylic resin.

15. A process according to claim 12, characterized in that the filler material (7) is an epoxy resin.

16. A process according to claim 12, characterized in that the glass transition temperature of the filler material (7) is comprised between 40° C. to 60° C.

17. A process according to claim 16, characterized in that at the time of its application, the viscosity of the filler material (7) ranges from 14500 mPas to 20000 mPas for a track (5) thickness of 400 μm, to viscosity ranging from 26000 mPas to 30000 mPas for a track (5) thickness of 210 μm.

* * * * *